United States Patent [19]

Utsunomiya

[11] Patent Number: 4,520,339
[45] Date of Patent: May 28, 1985

[54] LOAD CELL WITH ADJUSTABLE BRIDGE CIRCUIT

[75] Inventor: Michito Utsunomiya, Kusatsu, Japan
[73] Assignee: Kabushiki Kaisha Ishida Koki Seisakusho, Kyoto, Japan
[21] Appl. No.: 487,971
[22] Filed: Apr. 25, 1983
[30] Foreign Application Priority Data Apr. 26, 1982 [JP] Japan ............................ 57-60942[U]
Apr. 26, 1982 [JP] Japan ............................ 57-60943[U]

[51] Int. Cl.³ .................. G01L 1/22; G01G 3/14; H05K 1/00; H05K 3/22
[52] U.S. Cl. .................................... 338/5; 73/862.65; 73/862.67; 73/862.63; 73/726; 177/211
[58] Field of Search .................. 338/5, 3, 2, 4; 73/862.65, 862.67, 862.63, 726; 177/211

[56] References Cited

U.S. PATENT DOCUMENTS

| | | | |
|---|---|---|---|
| 3,005,170 | 10/1961 | Starr | 338/2 |
| 3,427,715 | 2/1969 | Mika | 29/626 |
| 3,577,779 | 5/1971 | Laimins | 73/141 |
| 3,916,266 | 10/1975 | Bennett et al. | 317/100 |
| 3,958,456 | 5/1976 | Jacobson | 338/5 X |
| 4,267,724 | 5/1981 | Spoor | 73/862.65 |
| 4,332,174 | 6/1982 | Suzuki et al. | 73/862.67 X |
| 4,343,197 | 8/1982 | Suzuki et al. | 338/2 X |

FOREIGN PATENT DOCUMENTS

| | | |
|---|---|---|
| 55-76922 | 6/1980 | Japan ........................ 73/362.63 |
| 1095208 | 12/1967 | United Kingdom . |
| 2051373 | 1/1981 | United Kingdom . |
| 2061623 | 5/1981 | United Kingdom . |

OTHER PUBLICATIONS

Galvanotechnik, vol. 72, No. 6, Jun. 1981, pp. 687–689, Saulgau, Germany by K. Lindner.

Primary Examiner—Roy N. Envall, Jr.
Assistant Examiner—C. N. Sears
Attorney, Agent, or Firm—Staas & Halsey

[57] ABSTRACT

A load cell, of the type that converts the magnitude of an applied load into an electrical signal, has a circuit board designed to facilitate wiring. The load cell includes a load cell body, strain gauges attached to the load cell body, and the circuit board which also is attached to the load cell body. The circuit board is composed of a flexible board, a wiring pattern formed on the flexible board, and soldering portions provided on the wiring pattern on either side of a bending portion at which the flexible board is bent for attachment to the load cell body. Symbol marks for identifying terminals are provided adjacent prescribed terminals of the wiring pattern formed on the circuit board.

4 Claims, 12 Drawing Figures

LOAD CELL WITH ADJUSTABLE BRIDGE CIRCUIT

BACKGROUND OF THE INVENTION

This invention relates to a load cell for converting the magnitude of an applied load into an electrical signal. More particularly, the invention relates to a load cell designed so that strain gauges and compensating elements can be connected thereto with facility.

Figure 1:
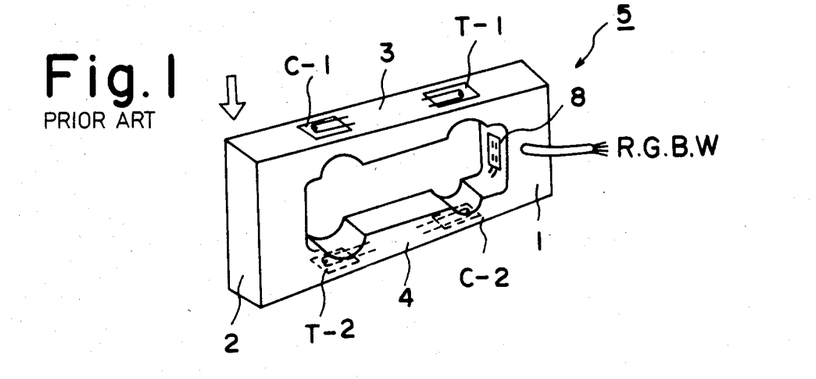
FIG. 1 is a perspective view illustrating an example of a load cell to which the present invention pertains.
Figure 2:
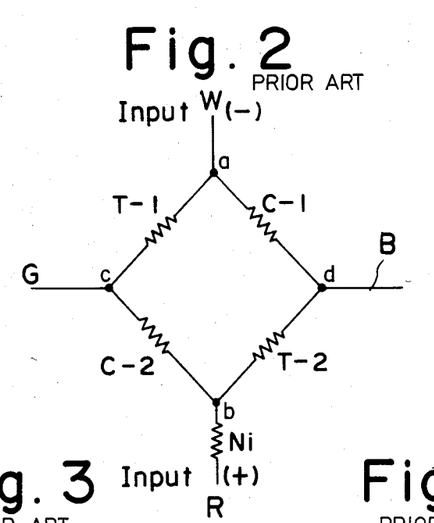
FIG. 2 is a circuit diagram of a bridge constructed by interconnecting strain gauges provided on the load cell illustrated in FIG. 1.

As shown in FIG. 1, a conventional bending beam-type load cell includes a stationary portion 1 for affixing the cell, a portion 2 for receiving an applied load, and parallel, flexible beams 3, 4 joining the fixed portion 1 and load-receiving portion 2. The beams 3, 4 include portions of reduced thickness and have strain gauges C-1, T-1, C-2, T-2 affixed thereto at respective ones of the reduced-thickness portions. As shown in FIG. 2, the four strain gauges C-1, T-1, C-2, T-2 are connected to form a bridge, a constant voltage is applied across the opposing junctions a, b through a feeder resistor Ni, and an electrical signal corresponding to the magnitude of a load applied to the load cell is obtained from across the other pair of opposing junctions c, d. More specifically, when a load is applied to the load-receiving portion 2, a potential difference develops across the junctions c, d owing to a change in the resistance of the strain gauges C-1, T-1, C-2, T-2, which measure the strain developed in the parallel beams of which load cell, the strain corresponds to the magnitude of the applied load. Reading the potential difference from output lines G, B makes it possible to detect the magnitude of the load.

Figure 3:
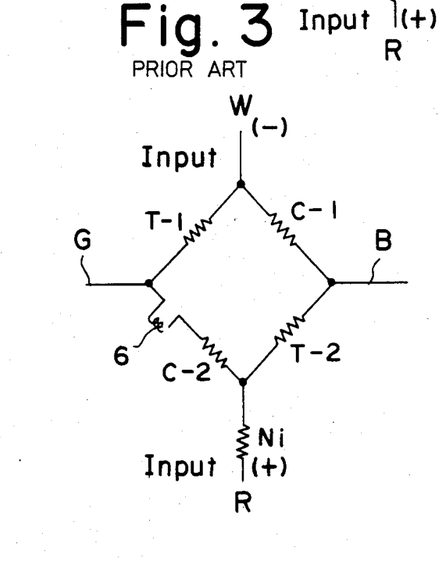
FIGS. 3 and 4 are circuit diagrams useful in describing adjustment of the bridge circuit of FIG. 2 according to the prior art.
Figure 4:
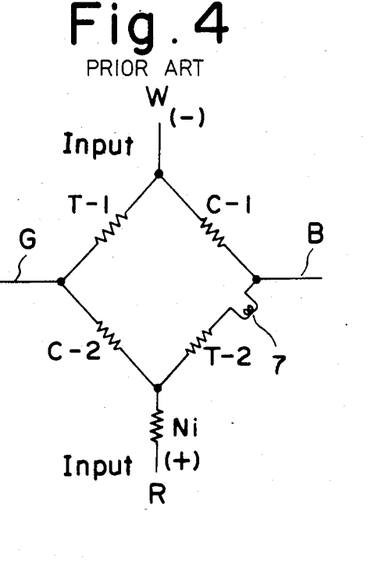

Following assembly, the load cell 5 is adjusted for bridge balance and is subjected to a zero-point temperature compensation. These operations are performed by measuring the output of the load cell 5 in the unloaded state, checking the measured value against a reference value to determine when the former is within allowable limits and, when the measured value falls outside of the allowable limits, inserting a compensating lead wire in series with prescribed ones of the strain gauges in the bridge circuit, this being decided in accordance with whether the measured value deviates toward the positive or negative side. For example, when there is a positive deviation caused by poor bridge balance, a compensating Constantan wire 6 is inserted in series with the strain gauge C-2, as illustrated in FIG. 3. On the other hand, if a zero-point deviation attributed to temperature indicates a shift toward the negative side, then this is compensated for by a fine copper wire 7 inserted in series with the strain gauge T-2, as shown in FIG. 4.

Figure 5:
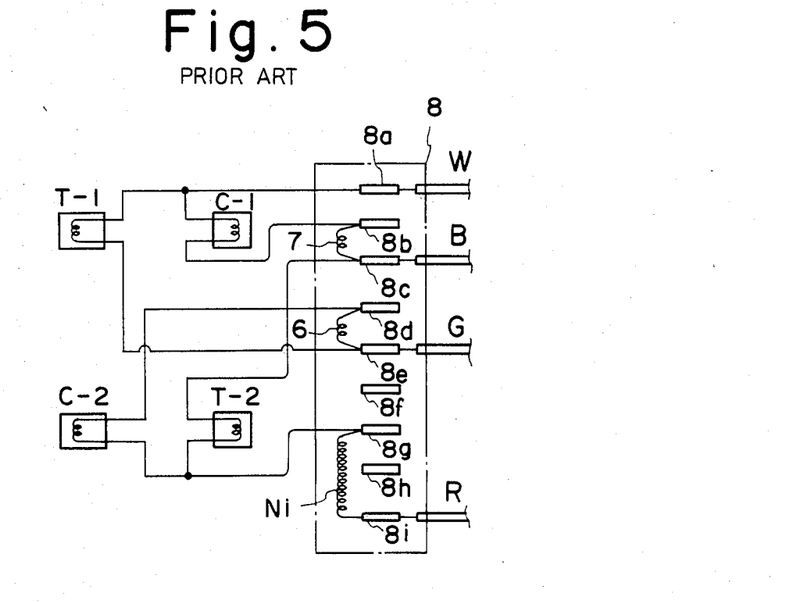
FIG. 5 is a schematic view illustrating the arrangement of a wiring terminal board useful in describing an adjustment according to the prior art.

The foregoing is shown in greater detail in FIG. 5, illustrating one example of how compensation is made. A terminal board 8 for effecting connections is attached to the load cell and is equipped with terminals 8a through 8i for connections to the lead wires from the strain gauges and to input and output leads R, G, B, W. The compensating Constantan wire 6 and compensating copper wire 7 are connected in series with the proper strain gauges according to the direction of deviation caused by poor bridge balance or temperature-induced zero shift, respectively. In the illustrated example of FIG. 5, the compensation is for a bridge balance shift on the positive side and a temperature-induced zero point shift which is also on the positive side. Thus the Constantan wire 6 is inserted in series with the strain gauge C-2 and the fine copper wire 7 is inserted in series with the strain gauge C-1. In general, the Constantan wire 6 is inserted in series with strain gauge C-2 for a positive bridge balance deviation and in series with strain gauge T-1 for a negative bridge balance. The fine copper wire 6 is inserted in series with strain gauge C-1 for a positive zero-point deviation caused by temperature, and in series with strain gauge T-2 for a negative zero-point deviation.

When correcting the load cell 5 through the foregoing means, the strain gauges C-1, T-1, C-2, T-2 are first connected directly to the external input and output leads R, G, B, W, a measurement is taken with the cell in the unloaded state, the magnitude and direction of any deviation, caused by bridge balance and a temperature-induced change in the zero point, is checked by using the measured results, and proper connections for effecting compensation are determined based on the preceding step. Then, strain gauge lead wires are disconnected from terminals 8c, 8e of the terminal board 8 by melting the solder joints and the required Constantan wire 6 or copper wire 7 is inserted be being soldered across the terminals 8e, 8d or 8b, 8c, respectively. Since the foregoing steps are performed within the very limited confines of the temporarily assembled load cell, operability is extremely poor and wiring errors are likely to occur.

Figure 6:
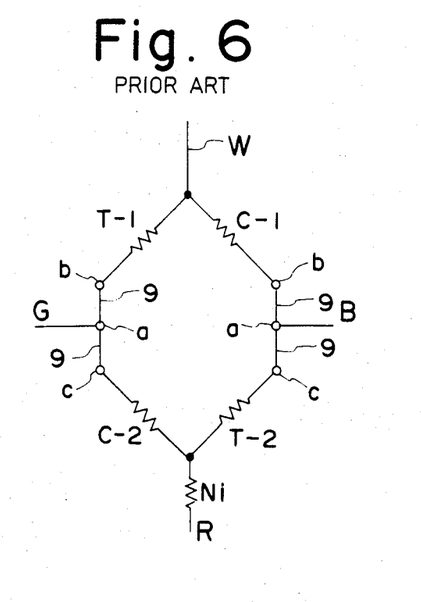
FIGS. 6 and 7 are circuit diagrams useful in describing adjustment of a bridge circuit according to another prior-art approach.
Figure 7:
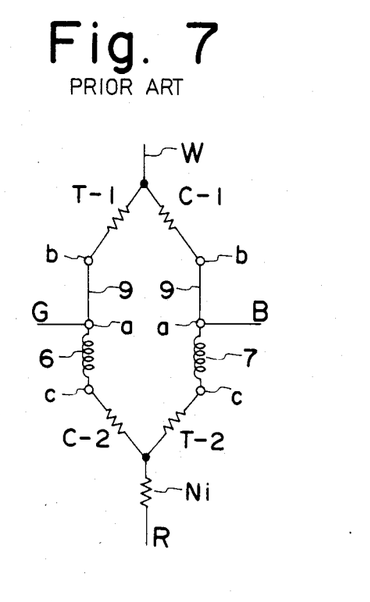

A known improvement over the foregoing is illustrated in FIG. 6. A set of three terminals a, b, c is provided at the connection between the strain gauges C-1, T-2 and the output lead B, and at the connection between the strain gauges T-1, C-2 and the output lead G. The output leads G, B are connected to respective ones of the centrally located terminals a, a, the ends of strain gauges T-1, C-1 are connected to the terminals b, b and the ends of strain gauges C-2, T-2 are connected to the terminals c, c. Short-circuiting leads 9 are connected between each central terminal a and the terminals b, c on either side thereof before the load cell is assembled. The arrangement is then provided on the beams 3, 4 (FIG. 1) with the strain gauges located at the proper positions to construct the load cell, after which the cell is subjected to measurement in the unloaded state in order to adjust the bridge balance. Thus, the initial connections are such that each of the strain gauges C-1, T-1, C-2, T-2 is connected to the output leads G, B by the short-circuiting leads 9. Conducting a measurement under these conditions makes it possible to determine the magnitude of a deviation caused by poor bridge balance or a change in zero point attributed to temperature. When the measured value falls outside the allowable limits relative to a reference value, the location at which a compensating lead wire should be inserted can be decided based upon whether the deviation is on the positive or negative side. The short-circuiting lead wire 9 at the proper position is then severed and removed and is replaced by inserting the Constantan wire 6 or fine copper wire 7. This completes the bridge balance adjustment of the load cell 5. A specific example of the conventional approach of FIG. 6 is as shown in FIG. 7, for a case where bridge balance indicated a positive deviation. A Constantan wire 6 is shown inserted across terminal a and terminal c, to which the strain gauge C-2 is connected. Also, to compensate for a negative deviation owing to a temperature-induced shift in zero point, a copper wire 7 is inserted across terminal a and terminal c, to which the strain gauge T-2 is connected.

Figure 8:
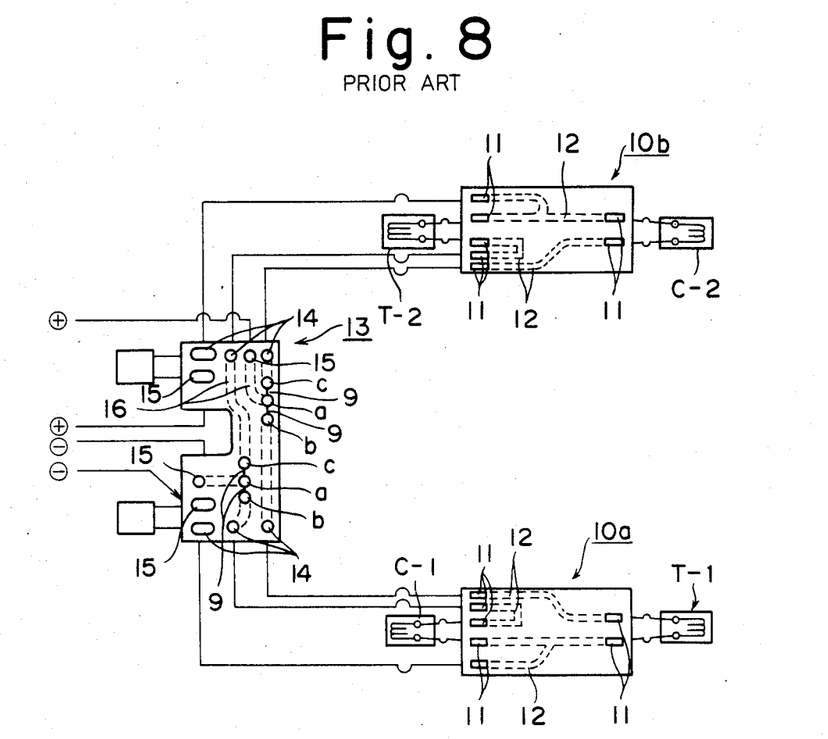
FIG. 8 is a schematic view illustrating the arrangement of a wiring circuit board for a prior-art method of adjustment.

FIG. 8 shows specific example of the wiring associated with the conventional method employed in FIGS. 6 and 7. Intermediate terminal boards 10a and 10b are for connecting the leads of the strain gauges C-1, T-1 and C-2, T-2, respectively, and for this purpose each comprises a printed circuit board having plural connection terminals 11 and wiring 12 formed thereon. A terminal circuit board 13 for the external input and output leads includes a circuit board on which there are formed plural connection terminals 14 for connection to the intermediate terminal boards 10a, 10b, plural terminals 15 for connecting external input and output leads, the two sets of terminals a, b, c for connecting the Constantan wire 6 or fine copper wire 7 (FIG. 7) and the short-circuiting lead wires 9, and the wiring 16.

With the conventional arrangement of FIG. 8, the intermediate circuit boards 10a, 10b are disposed on the load cell beams 3, 4 intermediate the respective strain gauges C1, T-1 and C-2, T-2, and the terminal board 13 is affixed to the stationary portion 1 of the load cell. An adjustment is carried out with the load cell 5 in the assembled state by measuring the output of the load cell in the unloaded condition, determining bridge balance and zero-point deviation from a reference value on the basis of the measured value, cutting out a maximum of two of the short-circuiting lead wires 9 from the proper positions when compensation is required, and replacing a removed lead wire 9 with the Constantan wire 6 or copper wire 7.

According to the method illustrated in FIGS. 6 through 8, the short-circuiting lead wires 9 are connected beforehand to the required points on the easily-assembled, separate printed circuit board 13, and the printed circuit board is affixed within the load cell. When it is necessary to compensate for poor bridge balance or a shift in the zero point due to temperature, a maximum of two of the short-circuiting lead wires 9 are severed and removed from the proper locations, and the Constantan wire 6 or fine copper wire 7 (or both) is inserted in place of the removed short-circuiting wire(s). The adjustment procedure is thus simplified and is less likely to invite wiring error.

In affixing the terminal board 13 to the load cell proper, the terminal board is attached in a bent condition because of limitations imposed by the dimensions of the load cell and the terminal board. While the terminal board itself bends freely owing to its flexibility, the electrical wiring patterns, formed of a metal foil such as copper foil, tend to break or sustain other damage owing to such bending. When breakage occurs, open points which develop in the wiring patterns from such breakage must be mended by connecting a lead wire across them. The repair work is extremely difficult, however, as it must be performed in a small amount of space. It is also very difficult to locate where the lead wires should be connected.

Another disadvantage with the above-described arrangement is the high probability that wiring errors will be made during an adjustment. The reason is the large number of terminals on the terminal board, and the fact that the location at which the Constantan wire is inserted differs depending upon the direction (positive or negative) of the bridge balance deviation. The same is true with regard to the insertion of the fine copper wire to compensate for a shift in the zero point caused by a temperature. Wiring errors are likely not only during adjustment but also when the strain gauges are connected to their respective terminal boards and when connections are made between terminal boards. Again, the reason is the multiplicity of terminals. To avoid errors during initial wiring and later adjustments, therefore, practice has been to refer to a wiring instruction manual during these operations. This makes wiring work very troublesome, however, and diminishes operating efficiency.

SUMMARY OF THE INVENTION

This invention relates to a load cell having a circuit board which facilitates wiring, such as for compensating for bridge balance deviation and for shift zero point caused by temperature.

Another object of the present invention is to provide a load cell having a wiring circuit board which enables severed wiring patterns to be repaired and closed when wiring patterns break owing to bending of the circuit board.

Still another object of the present invention is to provide a load cell having soldering portions provided on wiring patterns near the bending area of a wiring circuit board.

Yet another object of the present invention is to provide a load cell having a wiring circuit board which facilitates wiring work for connections to strain gauges or compensating elements.

A further object of the present invention is to provide a load cell wherein symbols instructive of wiring and adjustment procedures are provided alongside prescribed terminals of electrical wiring patterns formed on a wiring circuit board, whereby work for effecting connections is facilitated by referring to these symbols during wiring and adjustment work.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

Figure 9:
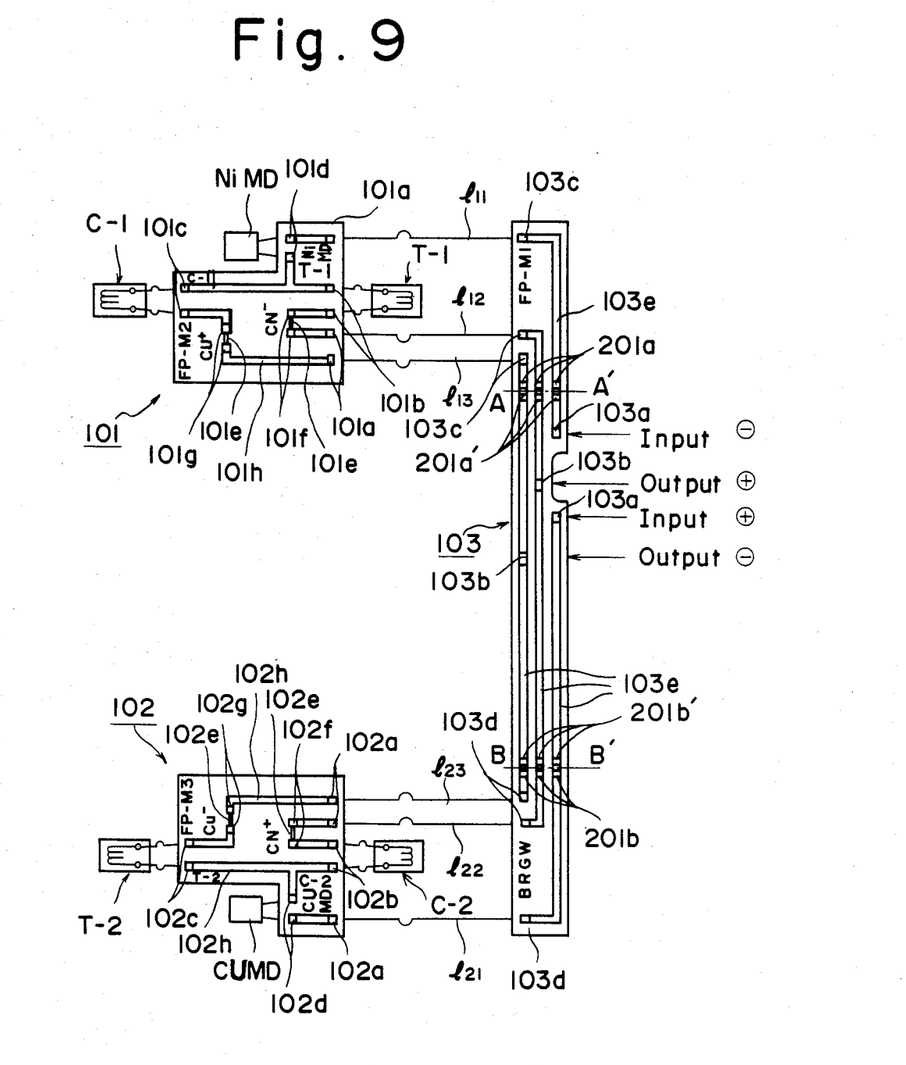
FIG. 9 is a schematic view illustrating an embodiment of load cell wiring using a wiring circuit board according to the present invention.

Reference will now be had to FIG. 9 to describe an embodiment of load cell wiring using a wiring circuit board according to the present invention. Numerals 101, 102 denote flexible circuit boards, referred to as intermediate terminal boards hereafter. Intermediate terminal board 101 provides connections for the strain gauges C-1, T-1, for a temperature-dependent compensating element NiMD, and for compensating Constantan and copper wires. Similarly, the intermediate terminal board 102 provides connections for the strain gauges C-2, T-2, for a temperature-dependent compensating element CUMD, and for the compensating Constantan and copper wires. Numeral 103 designates a belt-shaped, flexible circuit board, referred to as external lead terminal board hereafter. The intermediate terminal board 101 is formed to include three terminals 101a for connections to the external lead terminal board 103, a pair of terminals 101b to which the lead wires of strain gauge T-1 are connected, a pair of terminals 101c to which the lead wires of strain gauge C-1 are connected, a pair of terminals 101d across which the temperature-dependent compensating element NiMD is connected, a pair of terminals 101f across which a short-circuiting lead 101e ordinarily is connected, but across which a Constantan wire will be connected when bridge balance indicates a deviation on the negative side, a pair of terminals 101g across which a short-circuiting lead 101e ordinarily is connected, but across which a fine copper wire will be connected when the zero point indicates a temperature-induced deviation on the positive side, and wiring patterns 101h. Also provided on the intermediate terminal board 101 adjacent prescribed terminals are symbols for guidance during adjustment and wiring work. Specifically, symbols "T-1" appear alongside one of the terminals 101b, indicating that this is the terminal pair to which the strain gauge T-1 is to be connected. Similarly, symbols "C-1" are provided alongside one of the terminals 101c, indicating that this is the terminal pair to which the strain gauge C-1 should be connected. Further, "NiMD" is provided adjacent the pair of terminals 101d to indicate that this is the terminal pair to which the temperature-dependent compensating element NiMD should be connected. Symbols "CN−" are provided adjacent the pair of terminals 101f. These symbols indicate that a Constantan wire is to be connected across the terminals 101f when bridge balance deviates toward the negative side. Lastly, symbols "CU+" are provided adjacent the pair of terminals 101g, indicating that a fine copper wire is to be connected across the terminals 101g when the zero point deviates toward the positive side because of temperature.

The intermediate terminal board 102 is formed to include three terminals 102a for connections to the external lead terminal board 103, a pair of terminals 102b to which the lead wires of strain gauge C-2 are connected, a pair of terminals 102c to which the lead wires of strain gauge T-2 are connected, a pair of terminals 102d across which the temperature-dependent compensating element CUMD is connected, a pair of terminals 102f across which a short-circuiting lead 102e ordinarily is connected, but across which a Constantan wire will be connected when bridge balance indicates a deviation on the positive side, a pair of terminals 102g across which a short-circuiting lead 102e ordinarily is connected, but across which a fine copper wire will be connected when the zero point indicates a temperature-induced deviation on the negative side, and wiring patterns 102h. Also provided on the intermediate terminal board 102 adjacent prescribed terminals are symbols for guidance during adjustment and wiring work. Symbols "C-2" appear alongside one of the terminals 102b, indicating that this is the terminal pair to which the strain gauge C-2 is to be connected. Similarly, symbols "T-2" are provided alongside one of the terminals 102c, indicating that this is the terminal pair to which the strain gauge T-2 should be connected. Further, "CUMD" is provided adjacent the pair of terminals 102d to indicate that this is the terminal pair to which the temperature-dependent compensating element CUMD should be connected. Symbols "CN+" are provided adjacent the pair of terminals 102f. These symbols indicate that a Constantan wire is to be connected across the terminals 102f when bridge balance deviates toward the positive side. Lastly, symbols "CU−" are provided adjacent the pair of terminals 102g, indicating that a fine copper wire is to be connected across the terminals 102g when the zero point deviates toward the negative side because of temperature.

The external lead terminal board 103 is formed to include a pair of terminals 103a across which a constant voltage is applied, a pair of output tarminals 103b from across which a potential difference is detected, three terminals 103c for connection to corresponding ones of the terminals 101a on intermediate terminal board 101, three terminals 103d for connection to corresponding ones of the terminals 102a on intermediate terminal board 102, and wiring patterns 103e. The external lead terminal board 103 is bent along lines AA', BB' when being attached to the load cell body, as will be described later. Soldering portions 201a, 201a' and 201b, 201b' are formed on each wiring pattern 103e on either side of the bending portions indicated at lines AA', BB', respectively. The external lead terminal board 103 is also provided with symbols "BRGW" at its lower part. These indicate that a negative output line and a positive input line are to be connected to the lowermost terminals 103b, 103a, respectively, and that a positive output line and a negative input line are to be connected to the remaining terminals 103b, 103a, respectively.

Figure 10:
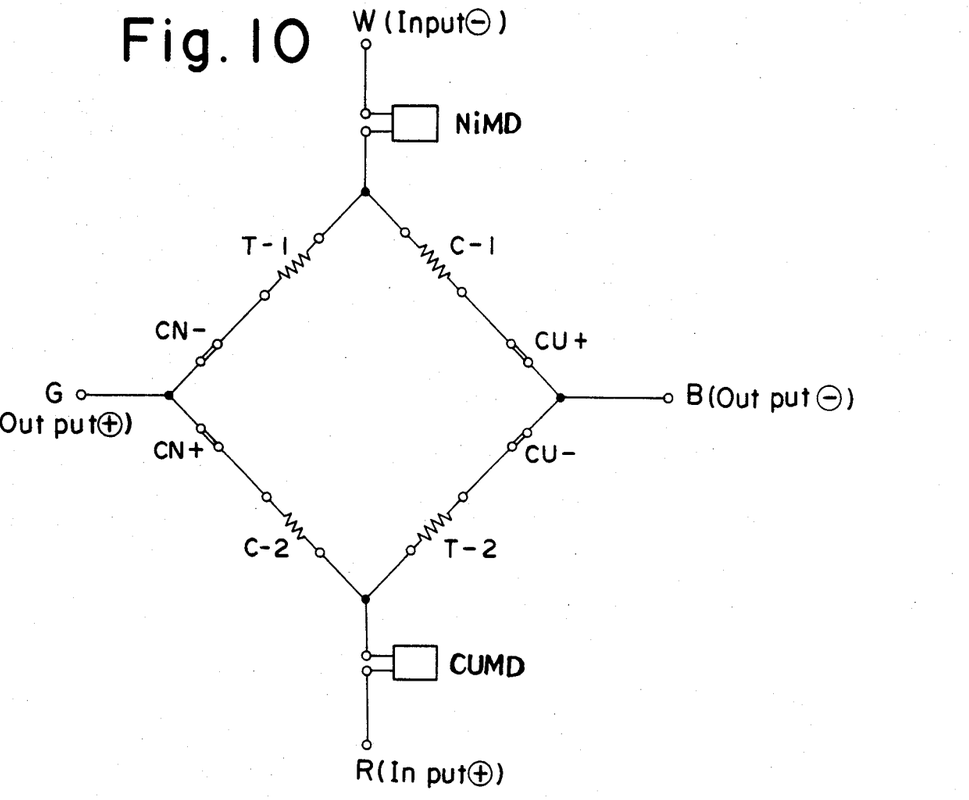
FIG. 10 is a circuit diagram of the arrangement shown in FIG. 9.

FIG. 10 shows a circuit diagram of the load cell arrangement of FIG. 9. The symbols agree with those of FIG. 9.

Figure 11:
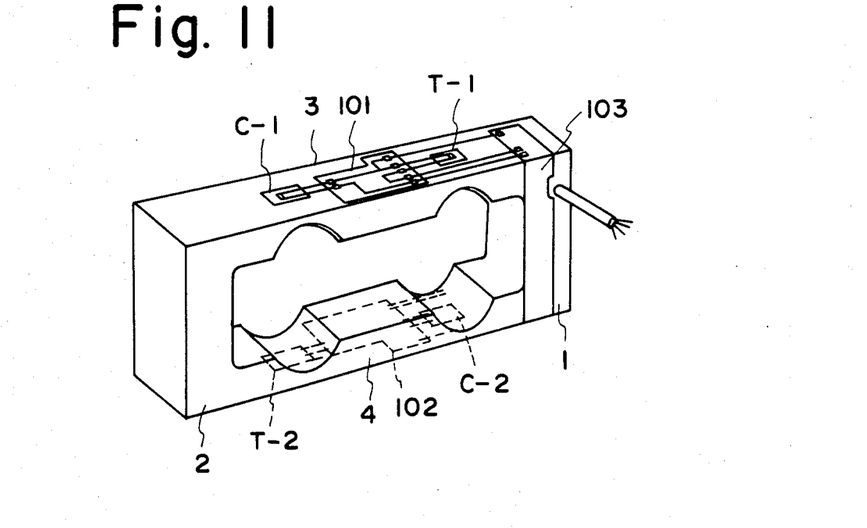
FIG. 11 is a perspective view showing the circuit board of FIG. 9 affixed to load cell body.
Figure 12:
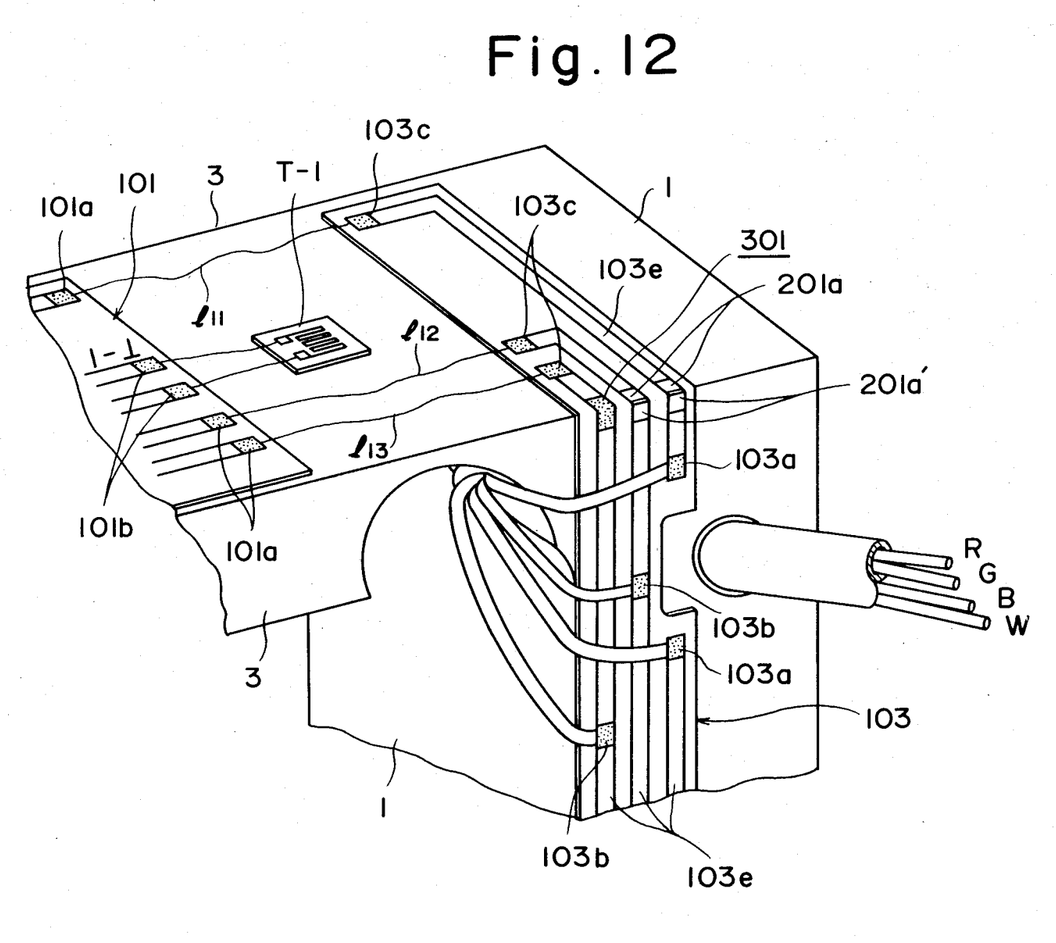
FIG. 12 is an enlarged, fragmentary perspective view showing a principal portion of the arrangement of FIG. 11.

Before proceeding with a wiring operation, the strain gauges C-1, T-1, C-2, T-2, the intermediate terminal boards 101, 102, and the external lead terminal board 103 are attached to the load cell body as illustrated in FIG. 11. The strain gauges C-1, T-1 and intermediate terminal board 101 are attached to the outer side of the beam 3, the strain gauges C-1, T-1 at the thin portions of the beam and the terminal board 101 at the thick portion therebetween. Similarly, the strain gauges C-2, T-2 and intermediate terminal board 102 are attached to the outer side of the beam 4, the strain gauges C-2, T-2 at the thin portions of the beam and the terminal board 102 at the thick portion therebetween. The external lead terminal board 103 is affixed to the stationary portion 1 of the load cell body by bending it along the lines AA', BB' in FIG. 8 so that the portions of the terminal board 103 having the sets of terminals 103c, 103d are attached to the same sides of the load cell body having the intermediate terminal boards 101, 102, respectively. The remaining portion of the terminal board 103 extending between the two bends is affixed to the front side of the stationary portion 1 as seen in FIG. 11. Any damage to the wiring patterns 103e caused by bending the terminal board 103 will be dealt with in a manner described below. Next, the leads of the strain gauges C-1, T-1 and C-2, T-2 are connected to the respective terminal pairs marked by the symbols "C-1", "T-1" and "C-2", "T-2" provided on the intermediate terminal boards 101 and 102, respectively. Likewise, the temperature-dependent compensating elements NiMD, CUMD are connected across the respective terminal pairs 101d, 102d indicated by the symbols "NiMD", "CUMD" provided on the intermediate terminal boards 101, 102, respectively. At about this time the three terminals 101a on the intermediate terminal board 101 and the three terminals 103c on the external lead terminal board 103 are interconnected by three lead wires $1_{11}$, $1_{12}$, $1_{13}$, respectively, as shown in FIGS. 9 and 12. Also, the three terminals 102a on the intermediate terminal board 102 and the three terminals 103d on the external lead terminal board 103 are interconnected by three lead wires $1_{21}$, $1_{22}$, $1_{23}$, respectively. If the connections made by the wires $1_{11}$, $1_{12}$, $1_{13}$ and $1_{21}$, $1_{22}$, $1_{23}$ are effected from uppermost to lowermost as in FIG. 9, wiring errors will not occur because of the positional correspondence between the sets of terminals on the intermediate terminal boards 101, 102 and the sets of terminals at each end of the external lead terminal board 103. Wiring errors also will not be likely to occur when connecting the strain gauges and temperature-dependent compensating elements to the intermediate terminal boards because the correct terminals are clearly marked by the symbols provided on these terminal boards.

After the wiring is completed, the output of the load cell in the unloaded state is measured and it is determined whether the measured value deviates from a reference value owing to poor bridge balance and a temperature-induced shift in the zero point. When compensation is necessary, the short-circuiting leads 101e, 102e are removed from the proper locations, decided by the direction of the deviations, and the removed leads are replaced by insertion of the Constantan wire or fine copper wire. For example, if the bridge balance shows a deviation on the negative side and the zero point a deviation on the positive side, then the short-circuiting leads 101e, 101e connected across the terminal pairs marked with the symbols "CN", "CU" are removed and are replaced by inserting the Constantan wire and fine copper wire between these terminal pairs, respectively. Thus, adjustments conforming to the direction of deviation can be performed correctly by referring to the symbols displayed clearly on the intermediate terminal boards 101, 102, thus eliminating the risk of error.

It should be noted that the symbols referred to above are formed at the same time as the wiring patterns 101h, 102h by etching a copper foil disposed on the terminal boards.

Since attaching the external lead terminal board 103 to the load cell body necessitates bending along the lines AA', BB' shown in FIG. 9, the copper foil forming the wiring patterns 103e is subjected to considerable bending and twisting so that the wiring patterns occasionally sustain such damage as breakage and severance along the bent portions. According to a feature of the invention, however, each wiring pattern 103e has the soldering portions 201a, 201a' and 201b, 201b' formed thereon on either side of the bends indicated by the lines AA', BB', respectively. If a wiring pattern 103e should be damaged at one or both of the bends, therefore, the damage can be repaired quickly and easily by soldering together the portions 201a, 201a' and/or 201b, 201b', assuring that the wiring pattern 103e will permit full conduction across the bend.

A fragmentary, enlarged perspective view of a load cell according to the invention is illustrated in FIG. 12, showing, in greater detail, soldering portions 201a, 201a' as they appear after the terminal board 103 has been attached to the load cell body. Numeral 301 indicates solder applied to such soldering portions for the purpose of soldering closed a wiring pattern the copper foil of which was severed by bending.

According to the present invention as described and illustrated hereinabove, wiring patterns formed on a flexible circuit board and damaged by bending the circuit board, in the process of attaching the board to a device such as a load cell, can be repaired quickly and easily. Also, predetermined terminals for patterns formed on a terminal or circuit board are identified by closely adjacent symbols provided on the board to guide wiring and adjustment work so that these may be performed without error. It is therefore unnecessary to refer constantly to instructions or the like during wiring, thereby enabling wiring work to be carried out with greater efficiency.

As many apparently widely different embodiments of the present invention can be made without departing from the spirit and scope thereof, it is to be understood that the invention is not limited to the specific embodiments thereof except as defined in the appended claims.

What we claim is:

1. A load cell for converting the magnitude of an applied load into an electrical signal, comprising:
    a load cell body including
        a stationary mounting portion,
        a portion for receiving an applied load, and
        a pair of parallel, flexible beams joining said stationary mounting portion and said load-receiving portion, each of said flexible beams having portions of reduced thickness;
    a respective pair of strain gauges provided on each said flexible beam, each at a respective one of said portions of reduced thickness; and
    a flexible external lead circuit board which is bent at two respective bending portions thereof and attached to three respective sides of said stationary mounting portion of said load cell body, said flexible external lead circuit board having a wiring pattern formed thereon, with soldering portions on either side of said bending portions, and a plurality of terminals;
    a respective intermediate terminal board located on each of said flexible beams between the respective pair of strain gauges and having wiring patterns and terminals for connection to the respective strain gauges, for connection to respective terminals of said external lead circuit board and further for selective connection of compensation elements thereto,
    lead wires for connecting said strain gauges with respective ones of said terminals of the respective intermediate terminal boards, and respective terminals of the intermediate terminal boards with respective terminals of the external lead circuit board, to form a bridge circuit.

2. The load cell of claim 1, wherein said terminals of said external lead circuit board for connecting to the terminals of the respective intermediate terminal boards are formed on respective parts of said external lead circuit board so that the respective lead wires connecting therebetween extend only over the respective face of said load cell body, and said bending portions divide said parts of said external lead circuit board.

3. The load cell of claim 1, comprising said external lead circuit board and said intermediate terminal boards having symbol marks thereon adjacent respective ones of said terminals.

4. The load cell of claim 3, wherein said wiring patterns and said symbol marks are of etched copper foil on the circuit board.

* * * * *